Figure 1:
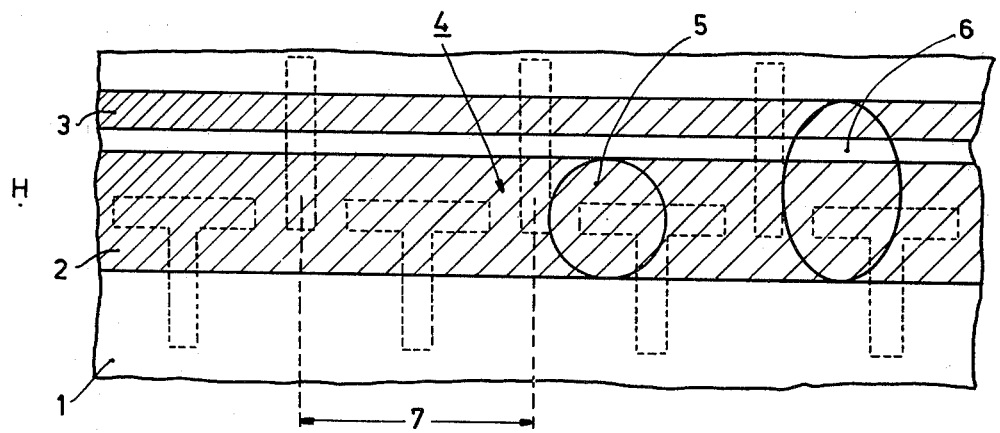

United States Patent [19]

Druyvesteyn et al.

[11] 4,052,707
[45] Oct. 4, 1977

[54] MAGNETIC DEVICE HAVING DOMAINS OF TWO DIFFERENT SIZES IN A SINGLE LAYER

[75] Inventors: Willem Frederik Druyvesteyn; Harm Marinus Wilhelm Booij, both of Eindhoven, Netherlands

[73] Assignee: U.S. Philips Corporation, New York, N.Y.

[21] Appl. No.: 666,654

[22] Filed: Mar. 15, 1976

Related U.S. Application Data

[63] Continuation of Ser. No. 512,686, Oct. 7, 1974, abandoned.

[30] Foreign Application Priority Data

Oct. 6, 1973  Netherlands .......................... 7313755

[51] Int. Cl.² ............................................. G11C 19/08
[52] U.S. Cl. ............................................... 340/174 TF
[58] Field of Search .................................... 340/174 TF

[56] References Cited

U.S. PATENT DOCUMENTS

| 3,701,129 | 10/1972 | Copeland | 340/174 TF |
| 3,728,153 | 4/1973 | Heinz | 340/174 TF |
| 3,811,120 | 5/1974 | Bobeck | 340/174 TF |

*Primary Examiner*—James W. Moffitt
*Attorney, Agent, or Firm*—Frank R. Trifari; Carl P. Steinhauser

[57] ABSTRACT

A magnetic device comprising at least one thin layer of a magnetizable material having a preferred direction of magnetization which is approximately perpendicular to the surface of the layer in which magnetic domains are generated, maintained and possibly annihilated in the layer. A domain guiding structure which with a given magnetic field substantially in the preferred direction enables the occurrence of two types of magnetic domains. The area of the largest domain is at least 15% and at most 125% larger than that of the other domains. The device also has means which convert one type of domain into the other type of domain.

9 Claims, 8 Drawing Figures

MAGNETIC DEVICE HAVING DOMAINS OF TWO DIFFERENT SIZES IN A SINGLE LAYER

This is a continuation of application Ser. No. 512,686, filed 10/7/74 and now abandoned.

The invention relates to a magnetic device comprising at least one thin layer of a magnetizable material having a preferred direction of magnetization which is approximately perpendicular to the surface of the layer and further comprising means for generating, maintaining and possibly annihilating magnetic domains in said layer.

The rare earth and yttrium-orthoferrites and certain ferrites having garnet structure are examples of materials which may be used for this purpose. Amorphous metallic layers may also be used for this purpose. An external magnetic field H, the direction of which coincides at least substantially with the said preferred direction of magnetization in the plate serves as a means for generating, maintaining, and possibly annihilating the magnetic domains in plates and the said materials. The magnetic domains are, for example, circular-cylindrical and they can only exist in a stable form in the case of magnetic fields H the strength of which is between given limits. Said limit values for the field depend inter alia on the thickness of the plate in which the domains occur and on the chemical composition thereof. When the direction of the magnetization within the domains is directed opposite to the direction of H and H is varied within the said limits, the domains become smaller when H increases and become larger when H decreases. If the plate has a uniform thickness and a uniform composition, the domains which occur in the plate at a given field H have a given substantially equal size.

Various suggestions have been made for the use of such domains. In digital storage and/or processing devices, for example, the presence of a domain in a given place of the plate means the bit one or the bit zero and the absence of a domain in a given place of the plate means the bit zero or the bit one. The minimum distance between two adjacent domains is the bit distance. Such a device comprises a fixed number of places for the domains determined by a domain movement structure which is present on the layer and which is in relationship with the said bit distance. The number of domains is not always the same because this number depends upon the number of ones or zeros. As a result of this the size of the domains is not the same everywhere; it actually depends on the presence or absence of domains in the adjacent bit places. When a domain is surrounded by many occupied bit places, the radius of the domain as a result of the repelling interaction is smaller than of a domain having substantially no adjacent occupied bit places. This difference in size of the domains and the local occurrence of mutual translation forces caused by adjacent domains may result in a poor functioning of the storage and/or processing device. It is possible that the repelling interaction results in undesired annihilation of domains. Said undesired annihilation may be prevented by reducing the field H so that the domains become larger. A domain having substantially no adjacent occupied bit places, however, will become too large in that case and in certain cases become even strip-shaped. In order to reduce the difference in size of the domains and the translation forces caused by adjacent domains it has been endeavored to reduce the repelling interaction also in the case of adjacent occupied bit places. For that purpose a comparatively large bit distance is chosen. When the radius of the circular-cylindrical domains is R, then the bit distance generally is from 6R to 8R.

The invention provides a device in which, in principle, all the bit places are occupied and in which as a result of this the bit distance is smaller than in the above-described case. The difference between the bit zero and the bit one is realized by a different size of the domains. According to the invention the layer has a domain guiding structure which with a given magnetic field substantially in the preferred direction enables the occurrence of two types of magnetic domains, the area of the largest domains being at least 15% and at most 125% larger than that of the other domains. A domain guiding structure is to be understood to mean a structure which in the first instance determines the size of the domains in the layer. In a given case the two types of domains have the same shape and are, for example, both circular-cylindrical. In another case the two types of domains have different shapes and, for example, one type is circular-cylindrical and the other type is elongate.

For each domain all the adjacent bit places are occupied. The repelling interaction between the adjacent domains is only a function of the size of the domains, in which it should be taken into account that as regards size only two types of domains are present. As a result of this the variation in mutual interaction between domains in different places in the device is very small. This offers the opportunity of maintaining a smaller bit distance without this giving rise to poor functioning of the device. When the radius of the small circular-cylindrical domains is R, then in this case a bit distance of 3R to 4R is possible.

The two types of domains can be made in various manners. It is possible to connect the device to two sources each creating one type of domains. Furthermore it is possible to use one source which has means to convert one type into the other type. When the stored information should be changed or other information be processed, new domains should be supplied from the source(s) and at least a part of the domains present in the device should be removed. There is still another possibility of making the two types of domains. From a source one type is supplied to the device and the device has means which convert one type of domain into the other type of domain. Upon changing information, no new domains need be supplied from a source in this case and no domains present in the device need be removed. The device therefore in particular has means which convert one type of domain into the other type of domain.

Usually a domain movement structure is present on the layer for the transport of the domains. Now various possibilities present themselves. In the first case the domain guiding structure according to the invention and the domain movement structure are present on different sides of the layer. In the second case the domain guiding structure according to the invention and the domain movement structure are present on the same side of the layer. In the third case the domain guiding structure according to the invention and the domain movement structure are combined with each other.

Figure 2:
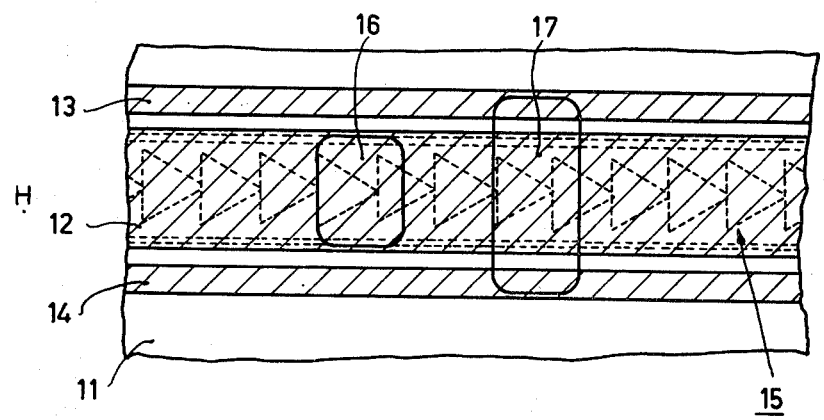
Figure 3:
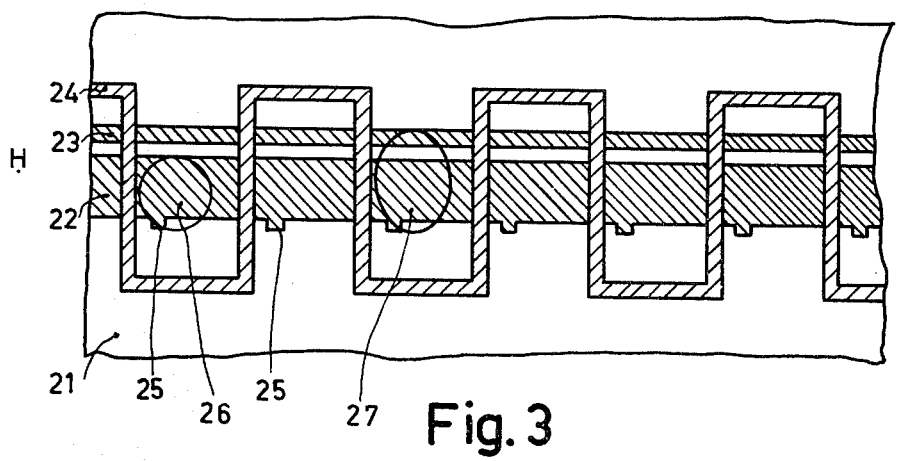
Figure 4A:
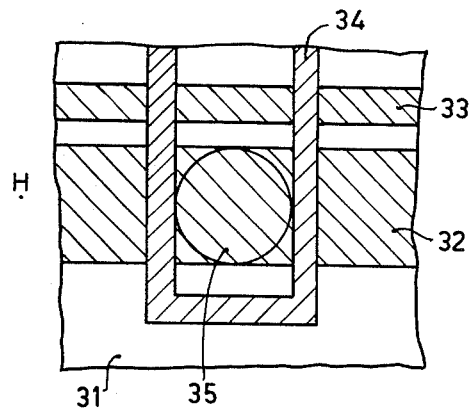
Figure 4B:
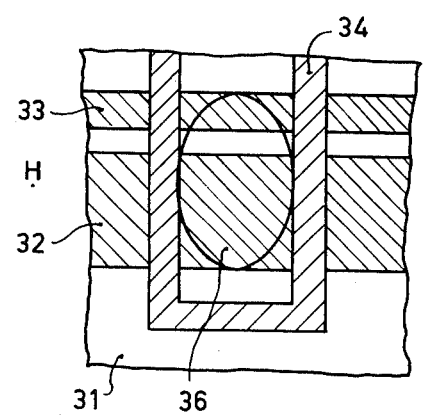
Figure 5A:
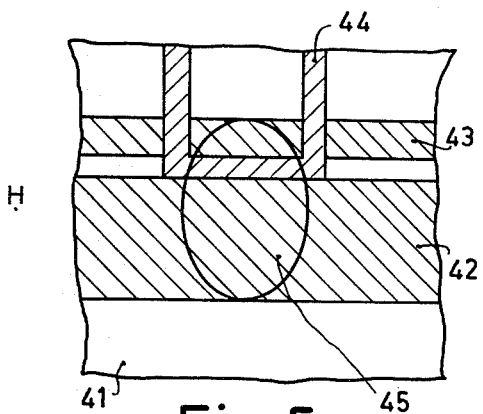
Figure 5B:
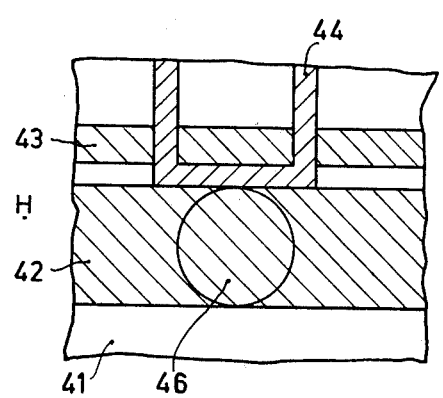
Figure 6:
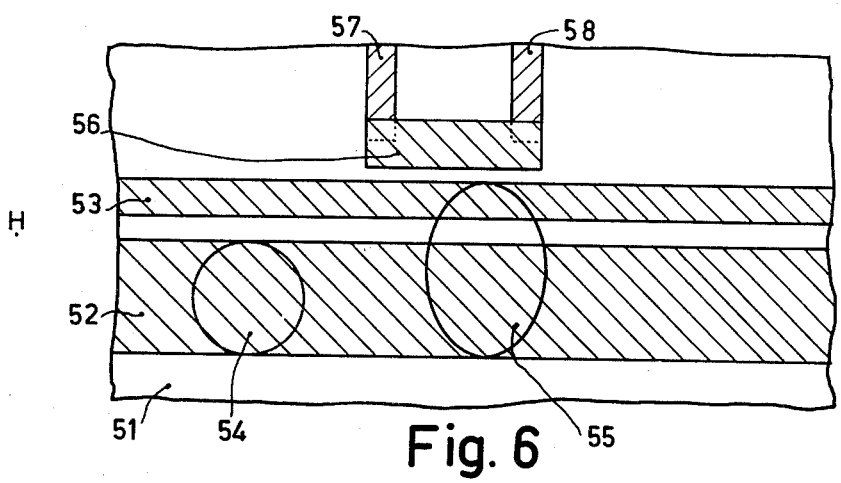

The invention will be described in greater detail, by way of example, with reference to the drawing in which FIGS. 1, 2 and 3 show magnetic devices having means for maintaining domains of different sizes with each time a different domain movement structure, FIGS. 4a, 4b 5a and 5b show magnetic devices having means for maintaining domains of different sizes and means for varying the size of the domains, and FIG. 6 shows a magnetic device having means for maintaining domains of different sizes and means for distinguishing between said domains.

FIG. 1 shows a part of a plate 1 of magnetizable material. Two permalloy strips 2 and 3 are present on the plate 1 of which 2 is wider than 3. These form the domain guiding structure. On the other surface of the plate 1 a T-I structure 4, also of permalloy, is present as is shown in broken lines. By means of a magnetic field rotating in the plane of the plate 1 (and produced by a device not shown) a magnetic domain 5 can be moved past the domain movement structure 4. The domain 5 is maintained by a given magnetic field H perpendicular to the plane of the plate, namely in co-operation with the strip 2. The magnetic field H in co-operation with the strips 2 and 3 maintains domains of larger dimensions than domain 5, like the domain 6 shown. The domain 6 can also be moved past the structure 4 by means of the magnetic field rotating in the plane of the plate 1. In the case shown the bit distance 7 is equal to 4R, R being the radius of the small domain 5. In a given case the plate 1 consists of $Sm_{0.3}Y_{2.7}Fe_{3.8}Ga_{1.2}O_{12}$ and has a thickness of 4.4 $\mu$m. The saturation magnetization at room temperature is 9 Gauss. The thickness of the permalloy of the strips 2 and 3 is 0.2 $\mu$m and of the domain movement structure 4 the thickness is 0.4 $\mu$m. The width of the strip 2 is 8 $\mu$m and that of the strip 3 is 2.5 $\mu$m. The distance between the strips 2 and 3 is 1.5 $\mu$m. The bit distance 7 is 16 $\mu$m. The value of the field H for maintaining the domains is 23 Oersted and of the rotating magnetic field it is 25 Oersted.

FIG. 2 shows a part of a plate 11 of magnetizable material. Present on the plate 11 are three permalloy strips 12, 13 and 14 of which 12 is wider than 13 and 14. The strips 12, 13 and 14 form the domain guiding structure. An angelfish structure 15, also of permalloy and shown in broken lines, is present on the other surface of the plate 11. By means of a magnetic field varying perpendicular to the plane of the plate 11 (and produced by a device not shown) a magnetic domain 16 can be moved past the structure 15. The domain 16 is maintained by the magnetic field perpendicular to the plane of the plate and that in co-operation with the strip 12. The magnetic field perpendicular to the plane of the plate in co-operation with the strips 12, 13 and 14 maintains domains of larger dimensions than domain 16, like the domain 17 shown. The domain 17 can also be moved along the structure 15 by means of the varying magnetic field.

FIG. 3 shows a part of the plate 21 of magnetizable material. The permalloy strips 22 and 23, of which 22 is wider than 23, are present on the plate 21. They constitute the domain guiding structure. On this structure a strip 24 of gold is present in a zig-zag shape. At the area of the upward and downward branches of the strip 24, the wide strip 22 has bulges 25. By means of an electric current through the strip 24, a magnetic domain 26 can be moved past the strip 22. The bulges 25 constitute an asymmetry which is necessary to determine the direction of movement. The domain 26 is maintained by a given magnetic field H perpendicular to the plane of the plate and that in co-operation with the strip 22. The magnetic field H in co-operation with the strips 22 and 23 maintains domains of larger dimensions than domain 26, like the domain 27 shown. The domain 27 can also be moved by means of an electric current through the strip 24.

FIG. 4a shows a part of a plate 31 of magnetizable material. Two permalloy strips 32 and 33 of which 32 is wider than 33 are present on the plate 31. They constitute the domain guiding structure. On this structure a U-shaped strip 34 of gold is present at the area of the strips 32 and 33. Furthermore, a domain movement structure (not shown) is present on one of the surfaces of the plate. At the area of the strip 32 and within the strip 34 a circular magnetic domain 35 is present in the plate 31 and is maintained by a given magnetic field H perpendicular to the plane of the plate. When an electric current pulse is conveyed through the strip 34 with such a polarity that the magnetic field produced by the current within the U-shaped strip 34 is directed oppositely to the external field H (and thus directed in the same direction as the magnetization of the domain 35) the domain becomes larger and obtains an elongate shape at the area of the strips 32 and 33, as is denoted by 36 in FIG. 4b. The remaining references are the same as in FIG. 4a. This domain 36 is maintained by the same magnetic field H. In the case shown the domain guiding structure (strips 32 and 33) and the strip 34 are present at the same surface of the plate 31. It is also possible that they are present at different surfaces of the plate 31. In a given case the plate 31 consists of $Sm_{0.3}Y_{2.7}Fe_{3.8}Ga_{1.2}O_{12}$ and has a thickness of 4.4 $\mu$m. The thickness of the permalloy strips 32 and 33 is 0.2 $\mu$m and that of the gold strip 34 is 0.3 $\mu$m. The width of the strip 32 is 8 $\mu$m and that of the strip 33 is 2.5 $\mu$m. The distance between strips 32 and 33 is 1.5 $\mu$m. The width of the strip 34 is 2 $\mu$m and the distance within the two limbs of the U-shape is 8 $\mu$m. The value of the field H for maintaining the domains is 23 Oersted. The radius of the domain 35 is 4 $\mu$m. When a current of 12 mA is conveyed through the strip 34 for 1 $\mu$sec. the domain 35 changes into the domain 36 having dimensions of 12 $\mu$m by 8 $\mu$m.

FIG. 5a shows a part of a plate 41 of magnetizable material. Two permalloy strips 42 and 43 of which 42 is wider than 43 are present on the plate 41. At the area of the strip 43 a U-shaped strip 44 of gold is present. Furthermore, a domain movement structure (not shown) is present on one of the surfaces of the plate. At the area of the strips 42 and 43 an elongate magnetic domain 45 which is maintained by a given magnetic field H perpendicular to the plane of the plate is present partly within the limbs of the U-shaped strip 44 in the plate 41. When an electric current pulse is conveyed through the strip 44 with such a polarity that the magnetic field produced by the current inside the U-shaped strip 44 is directed in the same direction as the external field H (and hence directed oppositely to the magnetization of the domain 45), the domain becomes smaller and obtains a circular shape at the area of the strip 42, as is denoted by 46 in FIG. 5b. The remaining references are the same as in FIG. 5a. This domain 46 is maintained by the same magnetic field H. In a given case the plate 41 consists of $Sm_{0.3}Y_{2.7}Fe_{3.8}Ga_{1.2}O_{12}$ and has a thickness of 4.4 $\mu$m. The thickness of the permalloy strips 42 and 43 is 0.2 $\mu$m and that of the gold strip 44 is 0.3 $\mu$m. The width of the strip 42 is 8 $\mu$m and that of the strip 43 is 2.5 $\mu$m. The distance between the strips 42 and 43 is 1.5 $\mu$m. The width of the strip 44 is 2 $\mu$m and the strip 44 thus is partly present on the strip 43. The distance inside the two limbs of the U-shape is 8 μm. The value of the field H for maintaining the domains is 23 Oersted. The dimensions of the domain 45 are 12 μm by 8 μm. When a current of 12 mA is conveyed through the strip 44 for 1 μsec, the domain 45 changes into the circular domain 46 having a radius of 4 μm.

FIG. 6 shows a part of a plate 51 of magnetizable material. Two permalloy strips 52 and 53 of which 52 is wider than 53 are present on the plate 51. A given magnetic field H perpendicular to the plane of the plate in co-operation with the strip 52 maintains domains of the shape of domain 54, while in co-operation with the strips 52 and 53 it maintains domains of the shape of domain 55. By means of a domain movement structure not shown the domains are moved past the strip 52 and the strips 52 and 53, respectively. A permalloy strip 56 which is very thin as compared with the strips 52 and 53 is present on the plate 51 parallel to the strips 52 and 53 on the side of the narrow strip 53 and is connected at the ends to strips 57 and 58 of gold which are present on the plate 51 and which are partly below the strip 56. The strips 56, 57 and 58 form part of the means for detecting the domains, of which means the remaining parts are not shown. When a domain of the shape 55 passes, a signal is induced in the detection device. When a domain of the shape 54 passes, substantially no signal is induced in the detection device. In this manner it is possible to distinguish between a zero and a one. In a given case the plate 51 consists of $Sm_{0.3}Y_{2.7}Fe_{3.8}Ga_{1.2}O_{12}$ and has a thickness of 4.4 μm. The thickness of the permalloy strips 52 and 53 is 0.2 μm, that of the permalloy strip 56 is 0.04 μm and that of the gold strips 57 and 58 is 0.3 μm. The width of the strip 52 is 8 μm and that of the strip 53 is 2.5 μm. The distance between the strips 52 and 53 is 1.5 μm. The dimension of the strip 56 in the direction parallel to the strips 52 and 53 is 12 μm. The width of the strip 56 is 3 μm. The width of the strips 57 and 58 is 2 μm. The distance between the strips 56 and 53 is 1 μm.

What is claimed is:

1. A magnetic bubble domain device comprising, a thin layer of magnetizable material having a preferred direction of magnetization approximately perpendicular to the surface of the layer and adapted to retain therein adjacently disposed magnetic domain regions, first and second strips of magnetic material spaced apart and arranged in substantially parallel relationship on said layer and defining a path of movement for magnetic domains in said thin layer, one of said strips having a width greater than the width of the second of said strips, means in cooperative engagement with said layer and said strips for maintaining successively arranged magnetic domains of a first size correlated to the width of said wider strip and of a second size correlated to the combined width of both of said strips, said second domain width having a value 15 to 125% greater than the said first domain width, along said path of movement, and means for moving the magnetic domains in said thin layer in said path of movement.

2. A magnetic bubble domain device as claimed in claim 1 wherein said means for maintaining said successively arranged magnetic domains comprises an asymmetrically positioned extending portion of one edge of the wider of said strips.

3. A magnetic bubble domain device as claimed in claim 1 wherein said domain moving means comprises a rectangular wave-shaped conductor in confronting relationship to said first and second strips.

4. A magnetic bubble domain device as claimed in claim 1 wherein said means for maintaining said successively arranged magnetic domains comprises magnetic coatings arranged on the side of said thin layer opposite to that of said magnetic strips along the said path of movement.

5. A magnetic bubble domain device as claimed in claim 4 wherein said magnetic coatings comprise alternately arranged T and I shaped segments.

6. A magnetic bubble domain device as claimed in claim 4 wherein said magnetic coatings comprise consecutively arranged triangular sections in series.

7. A magnetic bubble domain device as claimed in claim 1 wherein said domain moving means comprises a rectangular wave-shaped conductor arranged on said layer and asymmetrically positioned with respect to said strips.

8. A magnetic bubble domain device as claimed in claim 7 wherein said conductor comprises a segment arranged in confronting relationship to the space between said strips.

9. A magnetic bubble domain device as claimed in claim 7 wherein said conductor comprises a segment of magnetic material arranged adjacent to and substantially parallel to the more narrow of said strips.

* * * * *

UNITED STATES PATENT AND TRADEMARK OFFICE
CERTIFICATE OF CORRECTION

PATENT NO. : 4,052,707
DATED : October 4, 1977
INVENTOR(S) : WILLEM F. DRUYVESTEYN ET AL It is certified that error appears in the above-identified patent and that said Letters Patent are hereby corrected as shown below:

Column 6, lines 8 and 9, delete "width" and insert --area--;

Column 6, lines 14 and 23, delete "maintaining" and insert --moving--;

Signed and Sealed this

Seventh Day of March 1978

[SEAL]

Attest:

RUTH C. MASON
Attesting Officer

LUTRELLE F. PARKER
Acting Commissioner of Patents and Trademarks